(12) United States Patent
Ostergard

(10) Patent No.: US 6,946,677 B2
(45) Date of Patent: Sep. 20, 2005

(54) PRE-PATTERNED SUBSTRATE FOR ORGANIC THIN FILM TRANSISTOR STRUCTURES AND CIRCUITS AND RELATED METHOD FOR MAKING SAME

(75) Inventor: Toni Ostergard, Turku (FI)

(73) Assignee: Nokia Corporation, Espoo (FI)

( * ) Notice: Subject to any disclaimer, the term of this patent is extended or adjusted under 35 U.S.C. 154(b) by 105 days.

(21) Appl. No.: 10/172,796

(22) Filed: Jun. 14, 2002

(65) Prior Publication Data

US 2003/0230747 A1 Dec. 18, 2003

(51) Int. Cl.[7] .................................................. H01L 35/24
(52) U.S. Cl. .................................................. 257/40; 438/99
(58) Field of Search ............................ 257/40; 438/99, 438/82

(56) References Cited

U.S. PATENT DOCUMENTS 6,476,550 B1 * 11/2002 Oda et al. .................... 313/504
6,524,884 B1 * 2/2003 Kim et al. ..................... 438/99
6,603,139 B1 * 8/2003 Tessler et al. ................. 257/40
6,630,684 B2 * 10/2003 Lee et al. ...................... 257/40
6,661,034 B2 * 12/2003 Kawase ....................... 257/103

* cited by examiner

Primary Examiner—Sara Crane
(74) Attorney, Agent, or Firm—Ware, Fressola, Van Der Sluys & Adolphson LLP

(57) ABSTRACT

Grooves in a desired circuit configuration are formed in the surface of a substrate to pre-pattern the area to receive material forming an organic thin film transistor (OTFT) structure and interconnecting conductive paths. The OTFT material is deposited in the pre-patterned area using printing techniques such as ink jet printing. In one embodiment, the grooves are formed in the surface substrate during the injection molding process of the substrate. Interexchangeable device covers carry different substrates to provide different functionalities of an electronic device with which the covers are used.

21 Claims, 3 Drawing Sheets

PRE-PATTERNED SUBSTRATE FOR ORGANIC THIN FILM TRANSISTOR STRUCTURES AND CIRCUITS AND RELATED METHOD FOR MAKING SAME

TECHNICAL FIELD

The present invention relates generally to organic thin film transistor (OTFT) structures and organic circuits employed in user interfaces and input/output arrangements and deals more particularly with a pre-patterned substrate for receiving the OTFT structures and organic circuits. The invention further relates to a method for applying the organic semiconductor material and conductive material on the substrate using reel-to-reel manufacturing processes to produce the OTFT structure and organic circuit. The invention also deals with a method for defining and producing the pre-patterned areas for receiving the material forming the OTFT structure and organic circuit during the injection molding process of a substrate. The invention also deals with the inter-exchangeability of component structural elements carrying different substrates to provide different functionalities of a device with which the component structural elements are used.

BACKGROUND OF THE INVENTION

There is a continued consumer demand for smaller and lighter portable electronic devices, such as, for example, mobile telephones, musical devices and players, personal digital assistants and the like to provide increasing numbers of different functionalities and features. In such portable handheld devices, it is an important design goal and consideration to provide a reduction in the size of the different component structural elements and a higher degree of feature integration. It is a further important design goal and consideration to provide a simplified input/output (I/O) interface that is usable and inter-exchangeable with different devices or units as well as to reduce feature implementation and operational manufacturing costs.

Possible sources for size and cost reduction are the traditional electronic circuits/chips that are used and which can be unproportionally expensive in low cost applications. Recently developed circuit technology based on circuits built-up by Organic Thin Film Transistors (OTFTs) structures rather than on traditional silicon (Si) semiconductor circuits are being looked to for such low cost applications. An OTFT typically has a Field Effect Transistor (FET) configuration, where the semiconducting material is an organic component or material such as polymeric, oligomeric, or molecular for example, and the Gate (G), Source (S), and Drain (D) electrodes may be made of various metals. However, the OTFT can also be manufactured with organic electrodes, such as, for example, various known conductive polymers, oligomerics, or molecular organic material. A schematic representation of a typical OTFT, in this case an organic field effect transistor (OFET) structure, is illustrated as a bottom-gate configuration in FIG. 1 and as a top-gate configuration in FIG. 2.

Presently, it is known to those skilled in the art to manufacture OTFTs on flexible substrates, using for example, vacuum deposition techniques at low temperatures or by various solution processing technologies. The OTFTs with the best performance are manufactured by vacuum evaporation/sublimation techniques and are usually based on small organic molecules, such as, Pentacene and oligothiophenes, and metal "electrodes" (i.e., G, S, and D).

The performance (e.g., field-effect mobility, on/off-ratio, etc.) of these OTFTs can be even better than that for amorphous silicon, (a-Si) based devices. However, OTFTs can also be manufactured by various printing techniques also referred to as solution processing, using printed "electrodes" as well. The performance of a printed OTFT is usually not as good as the performance of a vacuum deposited OTFT. Nonetheless, the performance of a printed OTFT structure is more than adequate for low frequency applications. Furthermore, the charge carrier mobilities of solution processed OTFTs are approaching the maximum values achievable with vacuum evaporated OTFTs. In other words, if the printed organic circuits are used in low frequency applications such as input detection from a keyboard or output for controlling the illumination of a keyboard, the performance is more than adequate.

One technology used today to "print" OTFTs and organic circuits on substrates is based on ink-jet printing techniques and principles. The ink-jet printing technique provides a tool for depositing the various/multiple materials needed for organic circuits in an easily controlled process. One of the benefits of using a "printing" technique is the possible use of "reel-to-reel" (R2R) manufacturing processing to obtain circuits on a flexible or rigid substrate. Thus, the OTFTs are excellent candidates for simple and inexpensive mass manufacturing using R2R manufacturing processes. Ink-jet printing is one of the techniques that may be used in R2R manufacturing processes for printing flexible electronics such as, circuits, displays, and the like on various substrates. However, there is one drawback with the ink-jet printing of OTFT structures and circuits that is a result of the spreading of the ink-jet droplet when it hits the surface. Prior attempted solutions to this problem have been proposed including using various (physical) barriers to define or pre-pattern the area where the material is printed, or by surface treating the substrate, for example, by depositing a chemical barrier of some type as is known to those skilled in the art.

The barriers are usually made in a normal lithography process, i.e. deposition of resist, illumination through a mask, and the development of the illuminated pattern. This results in a "cavity" where the ink-jet droplet can spread evenly. The "chemical barrier" is made by surface treating the substrate into, for example, hydrophobic and hydrophilic areas, respectively (in the case of water soluble "ink"). The surface tension of the ink-jet droplet on the various regions will thus define the spreading of the droplet. The chemical treatment of the substrates is also often done in a "lithography" process.

The pre-patterning of a substrate using chemical barriers and the like as known to those skilled in the art for the depositing of organic materials on a substrate is an additional process that increases the cost of the technology used to apply the organic and inorganic material to the substrate surface. It would be desirable therefore to provide an alternate way or method to pre-define the area for receiving the organic material of the organic semiconductor device or organic circuit.

It would also be desirable to provide a method for simplifying the deposition of organic circuits on a substrate.

It is further desirable to provide a method for depositing organic or inorganic material on a suitable substrate for use in mass manufacturing of OTFT structures and circuits with R2R manufacturing processes.

SUMMARY OF THE INVENTION

The use of organic thin film transistors (OTFTs) in electronic devices lends itself to the mass manufacturing of the devices at a lower cost and in a shorter time frame for many applications. The use of OTFTs in mobile telephones for example, provide new "design" or feature opportunities and a solution for a higher degree of integration and added functionality into the electronic device covers which can be changed from device to device (inter-exchangeable covers), as well as a simplified I/O interface between the cover and the device. Furthermore, the use of organic transistors would facilitate the manufacture and use of thin flexible circuits.

Using substrates with pre-defined grooves or patterns in the substrate surface for receiving organic semiconducting material and organic conductive circuits on the substrate is less complex than currently known methods that use chemical barriers or surface treatment to define the organic material receiving area. Furthermore, because the organic circuit material deposited in the grooves or patterns would not extend or protrude beyond the surface of the substrate, but rather be inserted into the substrate, the risk of damaging the organic circuit by mechanical rubbing, etc, is minimized if not substantially eliminated.

In accordance with a first aspect of the present invention, a substrate for carrying an organic thin film transistor OTFT structure is presented. The substrate has a thickness and a surface of arbitrary size and shape. There is at least one groove in the substrate surface having a pre-defined pattern for carrying the OTFT structure.

Preferably, the groove pre-defined pattern in the substrate receives the source, drain, gate, insulating layer and semiconductor layer organic and inorganic materials to form the desired OTFT structure.

Preferably, there are other grooves in the substrate surface in a desired pattern for receiving organic conductive material defining circuit paths to interconnect the OTFT structures to produce an electrical circuit.

Preferably, the substrate is fabricated by injection molding and the grooves are formed in the substrate during the injection molding process.

Preferably, the materials forming the OTFT structure are printed in the groove predefined pattern.

Preferably, the grooves are formed in the substrate by stamping the substrate surface.

Preferably, the stamping process is a hot embossing process.

Preferably, the materials forming the OTFT structure in the groove pre-defined patterns are deposited by ink-jet printing techniques.

In accordance with a second aspect of the invention, a method for pre-patterning an area on a substrate to carry an organic thin film transistor (OTFT) structure is presented. The method comprises the steps of defining grooves in a desired pattern in the surface of the substrate and depositing organic and inorganic material defining the source, drain and gate electrodes and the insulating layer and the semiconductor layer in the grooves to form the OTFT structure.

Preferably, the step of defining grooves further comprises defining a top-gate OTFT structure.

Preferably, the step of defining grooves further comprises defining a bottom-gate OTFT structure.

Preferably, the method includes the steps of injection molding the substrate and defining the grooves during the injection molding process.

Preferably, the step of injection molding includes injection molding a flexible substrate.

Preferably, the step of defining grooves further comprises defining a desired circuit pattern to carry out a corresponding desired operational circuit functionality.

Preferably, the step of depositing further comprises printing the organic and inorganic materials on the substrate.

Preferably, the step of depositing comprises depositing by ink-jet printing.

DETAILED DESCRIPTION OF PREFERRED EMBODIMENTS

Figure 1:
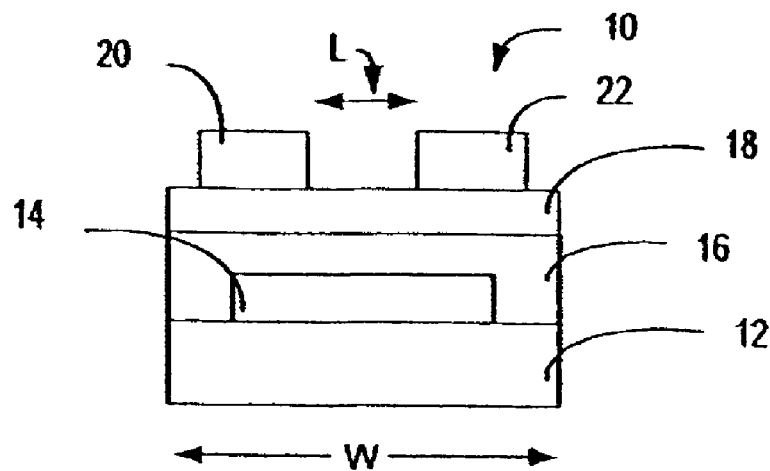
FIG. 1 is a schematic representation of a bottom-gate Organic Thin Film Transistor (OTFT) configuration.
Figure 2:
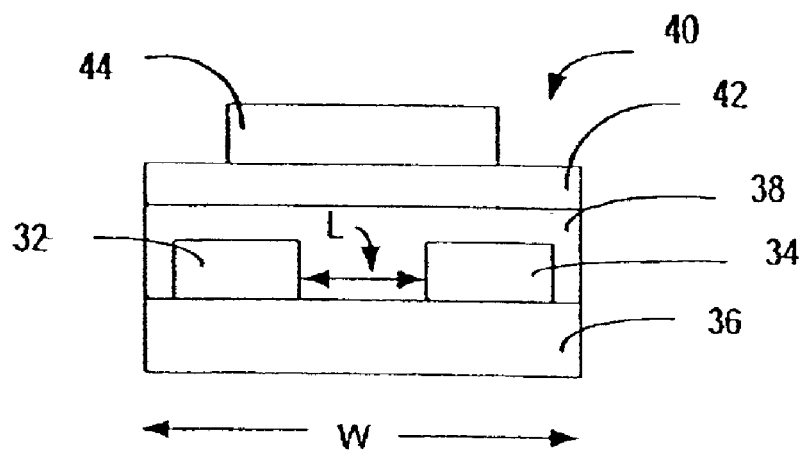
FIG. 2 is a schematic representation of a top-gate Organic Thin Film Transistor (OTFT) configuration.

Turning now to the drawings and considering the invention in further detail, an organic thin film transistor (OTFT) structure having a bottom gate configuration is illustrated in FIG. 1 and is generally designated 10. An organic thin film transistor (OTFT) structure having a top gate configuration is illustrated in FIG. 2 and is generally designated 40. As described above, the OTFT structure is deposited on a substrate 12 and in the case of the bottom gate configuration shown in FIG. 1, the gate 14 is deposited on the substrate 12 and is surrounded by an insulating layer 16. An organic semiconductor layer 18 is deposited on the insulating layer 16. The source 20 and the drain 22 are deposited on the organic semiconductor layer 18 and are spaced from one another a distance L.

In the case of a top gate OTFT structure configuration, as illustrated in FIG. 2, the source 32 and the drain 34 electrodes are deposited on the substrate 36 and are spaced a distance L from one another. An organic semiconductor layer 38 is deposited on the exposed area of the substrate 36 and on the source 32 and the drain 34 electrodes, respectively. An insulating layer 42 is deposited on the organic semiconductor layer 38. The gate terminal 44 is deposited on the insulating layer 42 to complete the structure. The distance between the source electrode and the drain electrode of an OTFT is referred to as the channel length L and is approximately 5 to 50 micrometers. The channel width W typically ranges from 50 to 500 micrometers. The concept of the invention is to define this area for holding the OTFT material in either the gate top or gate bottom configuration by pre-defining a pattern or grove in the substrate surface to receive the organic and inorganic material comprising the OTFT structure. Although specifically describing an OTFT structure, the invention contemplates other structures such as organic light emitting diodes (OLED) and is therefore not limited to OTFT structures.

Figure 3:
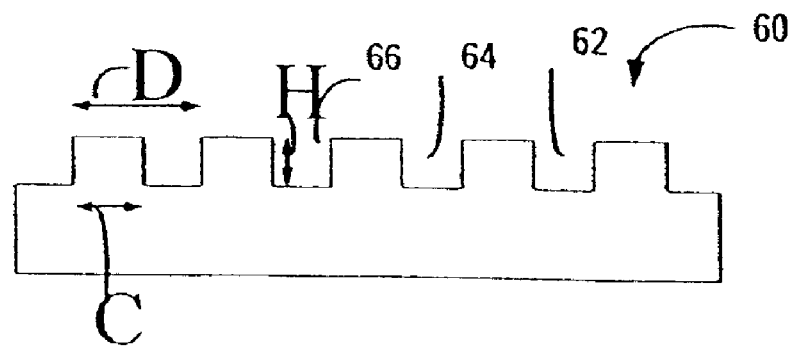
FIG. 3 is a cross-sectional schematic representation of an injection-molded piece in accordance with the present invention showing diffractive light-guide grooves formed in the injection molded piece.

In one embodiment of the invention, the substrate is an injection-molded piece, such as, for example, the cover of a mobile communication device, such as a mobile telephone. The area for depositing the organic thin film transistor material is defined in the injection-molding process as patterned grooves that are molded into the piece during the injection molding process. The areas where the organic materials are to be deposited or printed are taken into consideration during the design of the mechanics of the cover so that the pattern is molded into the surface of the device cover. One preferable method to define the grooves or patterns to accommodate the dimensions of the OTFT in the injection-molded piece is accomplished in a manner similar to manufacturing diffractive light guides with periodic grooves as shown in the cross-sectional schematic representation in FIG. 3, and generally designated 60. The injection-molded piece 60 has formed therein a number of periodic grooves 62, 64, 66. The grooves have a height dimension H that is approximately 0.5 micrometers. The period of the grooves is represented by the dimension D and is approximately 2.5 micrometers. The unfilled portion of the groove has a dimension C, wherein the groove-fill factor is represented by the expression "F=C/D". In this case, the fill factor for the above dimensions is in the range of approximately 0.2 to 0.5.

In this embodiment, the injection-molded grooves or grooved patterns define the spreading area of the organic material that is deposited, for example, as droplets from an applicator based on ink-jet printing techniques. The material is supplied to the ink-jet head from a reservoir of an appropriate type and the droplets are formed and ejected from the ink-jet head in a controlled manner to produce the proper and desired size drop to produce the desired coverage.

Figure 4:
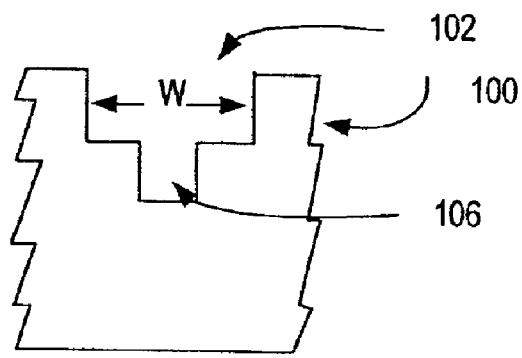
FIG. 4 is a cross-sectional schematic representation of an injection molded substrate in accordance with the present invention showing patterned grooves defined in the injection molding process for carrying the OTFT structure.

Referring to FIG. 4, a fragmentary cross-sectional schematic representation of an injection-molded substrate in accordance with the present invention is illustrated therein and generally designated 100. The injection-molded substrate includes patterned grooves, generally designated 102 and 106, which are formed during the injection molding process into the injection-molded piece. As illustrated in FIG. 4, the grooves form a pattern for a gate bottom organic thin film transistor structure as illustrated in FIG. 5.

Figure 5:
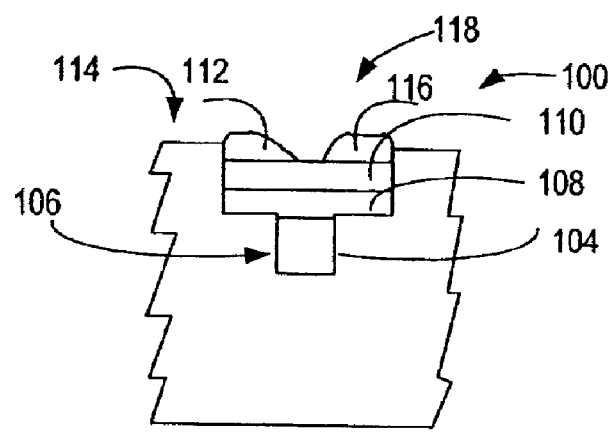
FIG. 5 is a cross-sectional schematic representation of an injection-molded substrate in accordance with the present invention showing a bottom-gate OTFT configuration printed into the patterned grooves formed therein.

In FIG. 5, the substrate 100 includes a gate terminal 104 deposited in the groove 106. An insulating layer 108 is next deposited over the gate terminal 104. Next, the organic semiconductor layer 110 is deposited over the insulating layer 108. Finally, the source terminal 112 is deposited on the surface of the organic semiconductor layer 110 in the region 114 and the drain material 116 is deposited on the organic semiconductor layer 110 in the region 118 to complete the organic thin film transistor structure.

Figure 6:
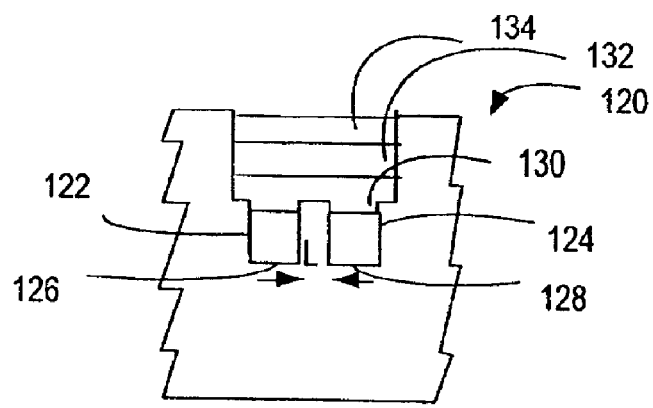
FIG. 6 is a cross-sectional schematic representation of an injection molded substrate in accordance with the present invention showing a top-gate OTFT configuration printed into the patterned grooves formed therein.

Referring to FIG. 6, a fragmentary view of an injection-molded substrate 120 is illustrated therein with a grooved pattern to produce a top gate organic thin film transistor structure, wherein the grooves are formed during the injection molding process. In this configuration, the source 122 and drain 124 electrodes are deposited in the grooves 126, 128, respectively. The grooves 126, 128 are separated by a distance dimension L which corresponds to the channel length. Next, the organic semiconductor layer 130 is deposited over the source 122 and the drain 124 terminals. Next, the insulating layer 132 is deposited over the organic semiconductor layer 130. Finally, the material forming the gate electrode 134 is deposited over the insulating layer 132 to complete the top gate organic thin film transistor structure.

Although an ink-jet printing technique has been described above for depositing the organic material on the substrate, the invention contemplates any and all printing techniques now known or future developed that accomplish the objective of the invention. Various printing techniques for depositing the organic and inorganic material on a substrate and particularly well suited for R2R manufacturing may be used with the present invention and include conventional or mechanical printing methods using printing plates or cylinders and digital printing methods such as electrophotography and ink jet. The printing methods include, but are not limited to, transfer methods such as gravure and rotogravure, flexo, screen printing, and other methods well known to those skilled in the printing art. The reader is referred to numerous textbooks and literature for additional methods and details. A report entitled "An Introduction to Printing Methods" by VTT Information Technology provides an explanation of many printing methods and which report is incorporated herein by reference.

Figure 7:
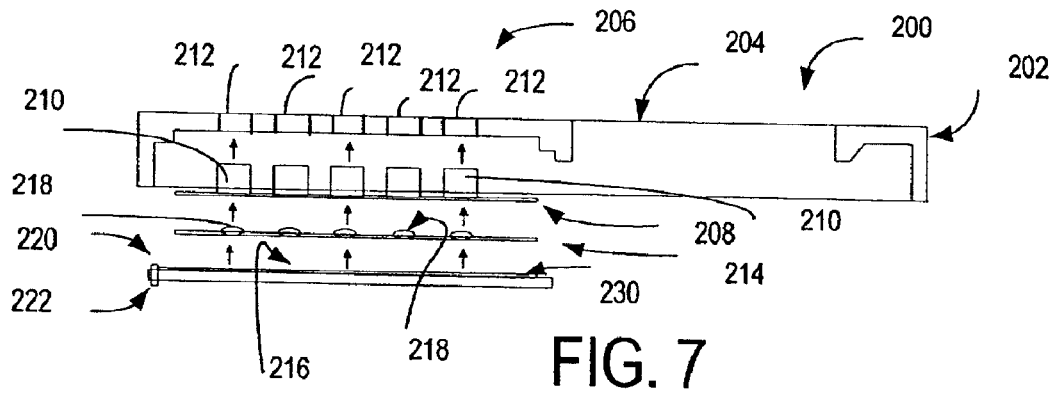
FIG. 7 is an exploded cross-sectional schematic representation of an OTFT printed back plane and organic circuit in accordance with the present invention for use with interchangeable device covers.

Turning now to FIG. 7, an exploded cross-sectional schematic representation of an organic thin film transistor printed back plane and organic circuit embodying the present invention, and which may be used with different exchangeable covers, is illustrated therein and generally designated 200. The device cover 202 is shown in cross-sectional view and is typical of the type of cover that may be used with a portable electronic device, such as a mobile telephone and the like, and has a display window region generally designated 204, and a keymat region generally designated 206. Typically, a keymat, generally designated 208, has one or more projecting areas or keys 210 which are dimensioned and shaped to pass through complementary openings 212 in the device cover 202 in the keymat region 206. A dome sheet, generally designated 214, serves as an interface connection between the keymat 208 and a printed circuit board, generally designated 220, for making contact with the corresponding aligned areas on the surface of the printed circuit board 220 when the corresponding key 210 is pushed on the keymat 208 forcing it to displace a dome 218 in the direction 216 to make contact with the printed circuit board surface.

In FIG. 7, the printed circuit board 220 is an injection-molded piece having a grooved pattern in the surface in accordance with the present invention to receive the materials forming the organic thin film transistor structures and organic printed circuit, generally designated 230. The organic printed circuit is electrically coupled to a serial interface connector, generally designated 222, and which serial interface connector 222 couples the electronic signals carried by the circuit formed with the organic thin film transistor structures and organic circuits to the operational circuit components of the electronic device. Typically, the serial interface connector 222 carries input/output signals in accordance with the operation of the keys 210 and the corresponding output signals generated by the circuit printed into the grooves on the injection-molded piece.

Figure 8:
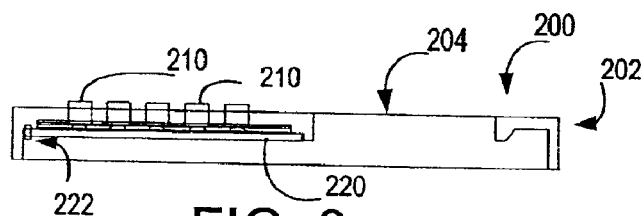
FIG. 8 is a cross-sectional view of the assembled components illustrated in FIG. 7.

A cross-sectional view of the assembled components illustrated in FIG. 7 is illustrated in FIG. 8 and like reference numbers refer to like parts.

Figure 9:
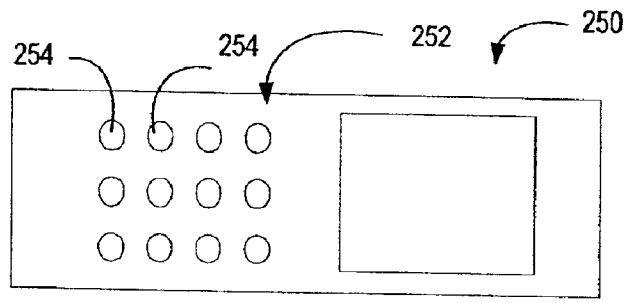
FIG. 9 is a top plan front view of an interchangeable device cover showing a keymat layout arrangement that may be used with the OTFT printed back plane and organic circuit of the invention.

FIG. 9 shows a top plan or front view of an interchangeable device cover 250 showing one keymat layout arrangement, generally designated 252, that may be used with the organic thin film transistor printed back plane and circuit of the invention. In this instance, the organic thin film transistor structures and organic printed circuit are arranged to accommodate the location of the keys 254 of the device cover 250. Since the electrical signals are carried from the cover via the serial interface connector 222, the interface with the operational circuit components of the functioning device will be the same regardless of the layout configuration of the device cover since the substrate is injection-molded with the appropriate locations for the organic thin film transistor structures and organic circuit paths.

Figure 10:
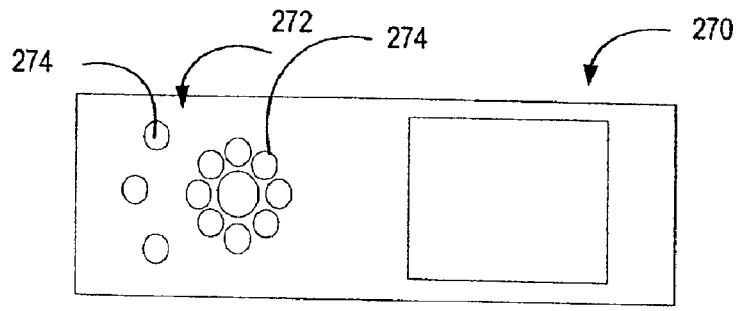
FIG. 10 is a top plan front view of an interchangeable device cover showing a different keymat layout arrangement from that shown in FIG. 9 and which may be used with the OTFT printed back plane and organic circuit of the invention.

FIG. 10 is a top plan or front view of an interchangeable device cover, generally designated 270, showing a different keymat layout arrangement, generally designated 272, from the keymat arrangement 252 illustrated in FIG. 9. Again, in accordance with the present invention, the substrate is injection-molded with the grooves located in the appropriate locations to accept the organic thin film transistor structures and printed paths corresponding to the locations of the keys 274 of the interchangeable device cover 270. As described above, the serial interface connector 222 carries the input/output electrical signals that are generated upon activation of the keys 274 to the principal operational circuitry of the device via the serial interface connector 222. Thus, it is seen that the areas where the organic thin film transistor materials are to be printed are taken into consideration during the design of the mechanics of the cover and the pattern is molded into the substrate in accordance with the desired circuit configuration. It will also be seen that by using a standard interface between the cover and the electronic device, inter-exchangeable covers having different layouts and/or different functionalities such as sensors, keymat arrangements, illumination and the like can be used. The ability to provide different functional circuits such as, serial-to-parallel, parallel-to-serial, amplifiers, counters, illumination, audio and visual indicators and the like allow different features and combinations of features to be implemented in a device, for example a mobile phone, by merely inter-exchanging the covers. It can be seen that a user might therefore change the layout and number of keys and the configuration of the keys on the user's device by merely changing the device cover as illustrated in FIGS. 9 and 10 without changing the device itself.

It will also be recognized by those skilled in the art that the invention contemplates pre-patterning of the grooves during the injection molding process. However, it will also be recognized that other substrates, such as flexible substrates, are equally applicable to the present invention. It will further be recognized that the pre-patterned grooves can be achieved by means other than in the injection molding process, for example, a stamping or hot embossing of the grooves into the substrate is also possible. It will also be recognized by those skilled in the art that the injection-molded substrate may also be implemented based upon traditional silicon chip construction and technology.

A method for forming grooves in an injection-molded substrate for pre-patterning or defining the area to receive materials forming an organic thin film transistor structure or circuit path has been described above in several preferred embodiments, including ink-jet printing of the organic material into the grooves in the substrate. It will be recognized by those skilled in the art that numerous changes may be made in the implementation of the present invention, for example, a parallel-to-serial converter circuit is identified above as an exemplary embodiment of a circuit that may be pre-patterned into the substrate; however, additional types of circuits, such as serial-to-parallel, amplifiers, counters, illumination, audio and visual indicators and the like, are also contemplated in accordance with the invention. Therefore, the invention has been described by way of illustration rather than limitation.

What is claimed is:

1. A substrate for carrying an organic thin film transistor (OTFT) structure, comprising:
    said substrate having a thickness and a surface of arbitrary size and shape, and
    at least one groove in said substrate surface having a predefined pattern for carrying the organic material comprising the OTFT structure, said groove predefined pattern defining the spreading area of said organic material.

2. The substrate as defined in claim 1 further comprising said groove predefined pattern receiving the source, drain, gate, insulating layer and semiconductor layer materials to form the desired OTFT structure.

3. The substrate as defined in claim 2 further comprising other grooves in a desired pattern for receiving organic conductive material defining circuit paths to interconnect the OTFT structures to produce an electrical circuit.

4. The substrate as defined in claim 1 wherein said substrate further comprises an injection molded substrate and said groove predefined pattern further comprises predefined injection molded grooves.

5. The substrate as defined in claim 2 wherein the OTFT structure further comprises printed respective source, drain, gate, insulating layer and semiconductor layer materials in said groove predefined pattern.

6. The substrate as defined in claim 2 wherein the OTFT structure further comprises inkjet printed respective source, drain, gate, insulating layer and semiconductor layer materials in said groove predefined pattern.

7. The substrate as defined in claim 1 wherein said at least one groove in the substrate is a hot embossed groove.

8. The substrate as defined in claim 1 wherein said at least one groove having a predefined pattern for carrying the OTFT structure further comprises a desired electrical circuit function pattern.

9. The substrate as defined in claim 8 wherein the desired electrical circuit function pattern further comprises a parallel-to-serial converter electrical circuit function.

10. The substrate as defined in claim 8 wherein the desired electrical circuit function pattern further comprises a serial-to-parallel converter electrical circuit function.

11. The substrate as defined in claim 8 further comprising said substrate being carried by a first inter-exchangeable cover of a first portable electronic device and comprising an interface between input/output operative functions and operational circuitry of the electronic device to carry out a first intended functionality.

12. The substrate as defined in claim 11 further comprising said substrate being printed with a different pattern and carried by a second inter-exchangeable cover used with said first portable electronic device to carry out a second intended functionality different than said first intended functionality when said first portable electronic device first interexchangeable cover is changed to said second interexchangeable cover.

13. A method for making a substrate for carrying the organic material comprising an organic thin film transistor (OTFT) structure, comprising the steps of:

providing a substrate having a thickness and a surface of arbitrary size and shape;

providing at least one groove having a predefined pattern in the surface of the substrate for carrying the OTFT structure, said groove predefined pattern defining the spreading area of the organic material.

14. The method as defined in claim 13 further comprising the steps of:

injection molding the substrate; and defining the grooves in the desired pattern during the injection molding process.

15. The method as defined in claim 13 wherein the step of defining grooves further comprises defining a top-gate OTFT structure.

16. The method as defined in claim 13 wherein the step of defining grooves further comprises defining a bottom-gate OTFT structure.

17. The method as defined in claim 13 further comprising the step of injection molding a flexible substrate.

18. The method as defined in claim 13 wherein the step of defining grooves further comprises defining a desired circuit pattern to carry out a corresponding desired operational circuit functionality.

19. The method as defined in claim 13 further comprising the step of depositing organic and inorganic material defining the source, drain and gate electrodes and the insulating layer and the semiconductor layer in the grooves to form the OTFT structure.

20. The method as defined in claim 19, wherein the step of depositing further comprises printing the organic and inorganic material on the substrate surface.

21. The method as defined in claim 19 further comprising depositing the material by ink-jet printing.

* * * * *